US009001387B2

(12) United States Patent
Muraki et al.

(10) Patent No.: US 9,001,387 B2
(45) Date of Patent: Apr. 7, 2015

(54) DRAWING APPARATUS, DATA PROCESSING METHOD, AND METHOD OF MANUFACTURING ARTICLE THAT TRANSFORM PARTIALLY OVERLAPPING REGIONS USING DIFFERENT TRANSFORMATION RULES

(71) Applicant: Canon Kabushiki Kaisha, Tokyo (JP)

(72) Inventors: Masato Muraki, Inagi (JP); Satoru Oishi, Utsunomiya (JP); Hiromi Kinebuchi, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 92 days.

(21) Appl. No.: 13/921,278

(22) Filed: Jun. 19, 2013

(65) Prior Publication Data

US 2013/0335503 A1   Dec. 19, 2013

(30) Foreign Application Priority Data

Jun. 19, 2012  (JP) ................................ 2012-138195
May 17, 2013  (JP) ................................ 2013-105628

(51) Int. Cl.
  *H03K 5/08*  (2006.01)
  *G11B 23/38*  (2006.01)
  *H01L 23/00*  (2006.01)
  *G03F 7/20*  (2006.01)
  *H01L 21/00*  (2006.01)
  *H01J 37/00*  (2006.01)

(52) U.S. Cl.
  CPC .............. *G11B 23/38* (2013.01); *G03F 7/2057* (2013.01); *H01L 24/00* (2013.01)

(58) Field of Classification Search
  None
  See application file for complete search history.

(56) References Cited

U.S. PATENT DOCUMENTS

| 4,806,987 | A   | * | 2/1989  | Mori et al. ...................... 355/53 |
| 5,999,244 | A   | * | 12/1999 | Yanagihara et al. ............ 355/53 |
| 6,225,013 | B1  | * | 5/2001  | Cohen et al. .................... 430/22 |
| 6,316,163 | B1  | * | 11/2001 | Magoshi et al. .............. 430/296 |
| 6,515,734 | B1  | * | 2/2003  | Yamada et al. ............. 250/492.2 |
| 8,159,649 | B2  | * | 4/2012  | Kato ............................... 355/53 |
| 8,237,914 | B2  | * | 8/2012  | Mos et al. ...................... 355/52 |
| 8,390,786 | B2  | * | 3/2013  | Laidig ............................. 355/53 |
| 2014/0154629 | A1 | * | 6/2014 | Kinebuchi .................... 430/296 |

OTHER PUBLICATIONS

Hakkennes, et al., "Demonstration of Real Time Pattern Correction for High Throughput Maskless Lithography", Alternative Lithographic Technologies III, Proc. of SPIE vol. 7970 79701A-11, published Apr. 1, 2011.

* cited by examiner

*Primary Examiner* — Scott A Rogers
(74) *Attorney, Agent, or Firm* — Rossi, Kimms & McDowell LLP

(57) ABSTRACT

A drawing apparatus performs drawing on a first partial region and a second partial region. The first and second partial regions having an overlap region in which the first and second partial regions overlap each other. The apparatus includes a transformation device configured to transform first pattern data for the first partial region into first quantized pattern data in accordance with a first transformation rule, and to transform second pattern data for the second partial region into second quantized pattern data in accordance with a second transformation rule different from the first transformation rule, and a controller configured to control the drawing on the first partial region based on the first quantized pattern data, and to control the drawing on the second partial region based on the second quantized pattern data.

10 Claims, 16 Drawing Sheets

F I G. 2B
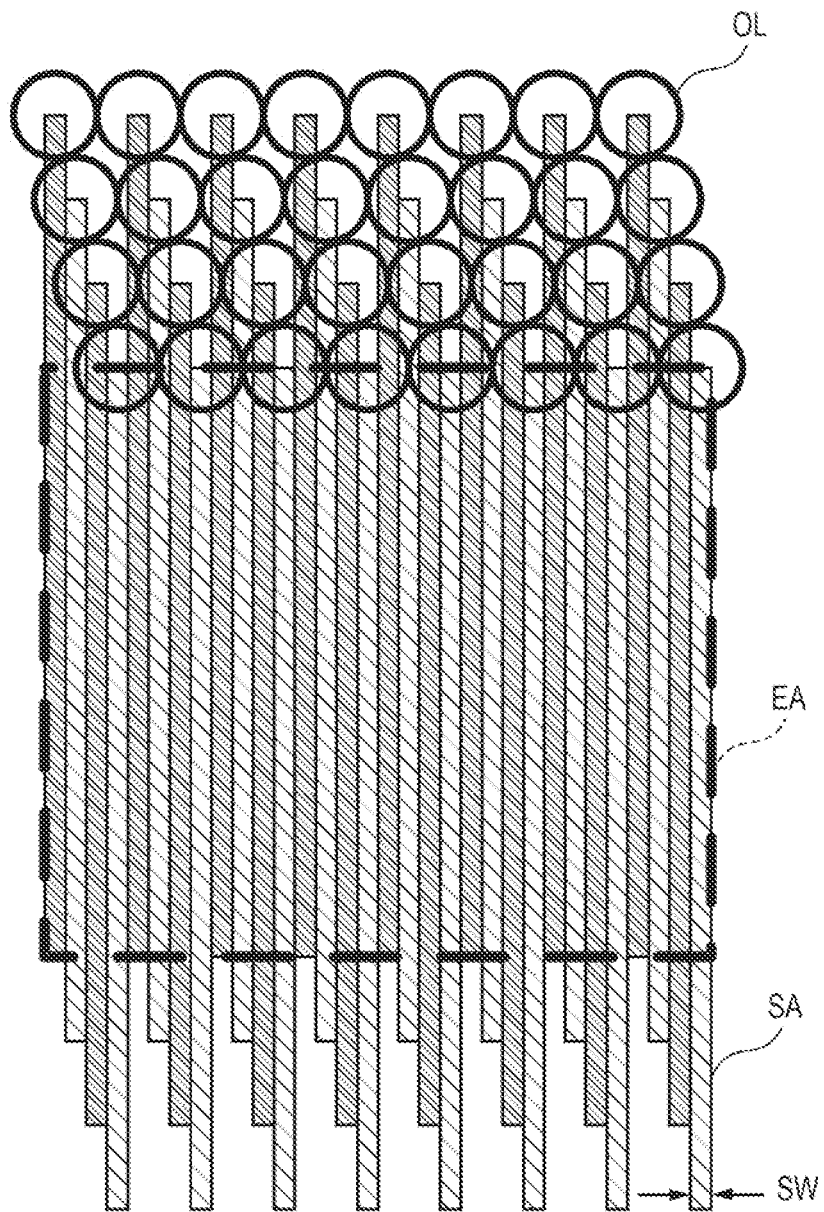

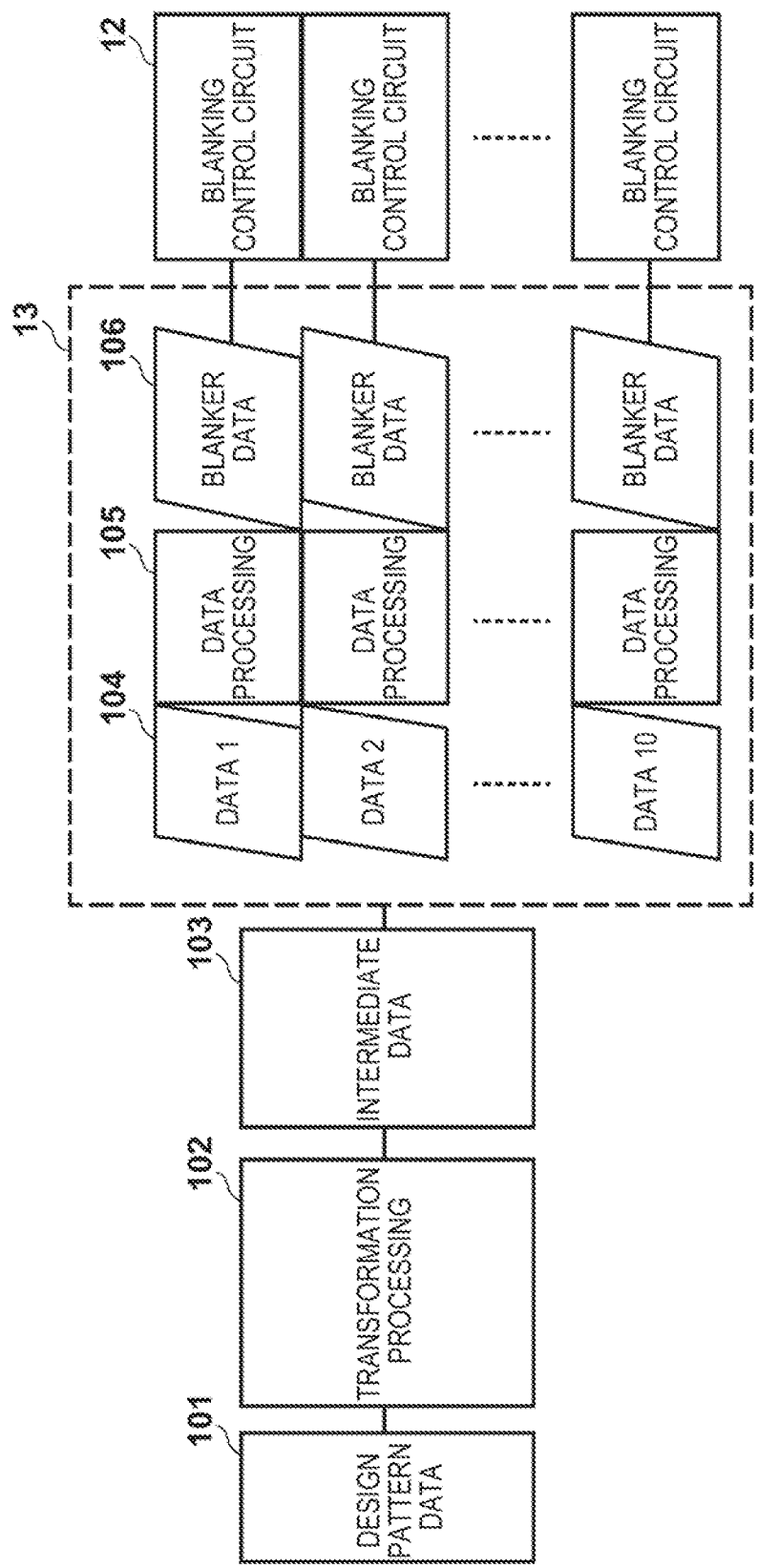

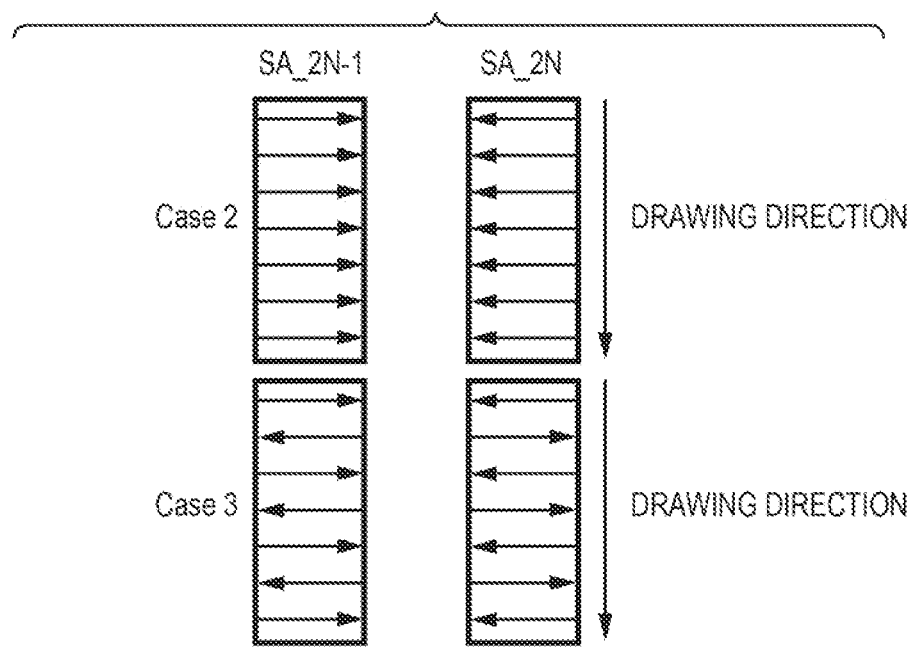

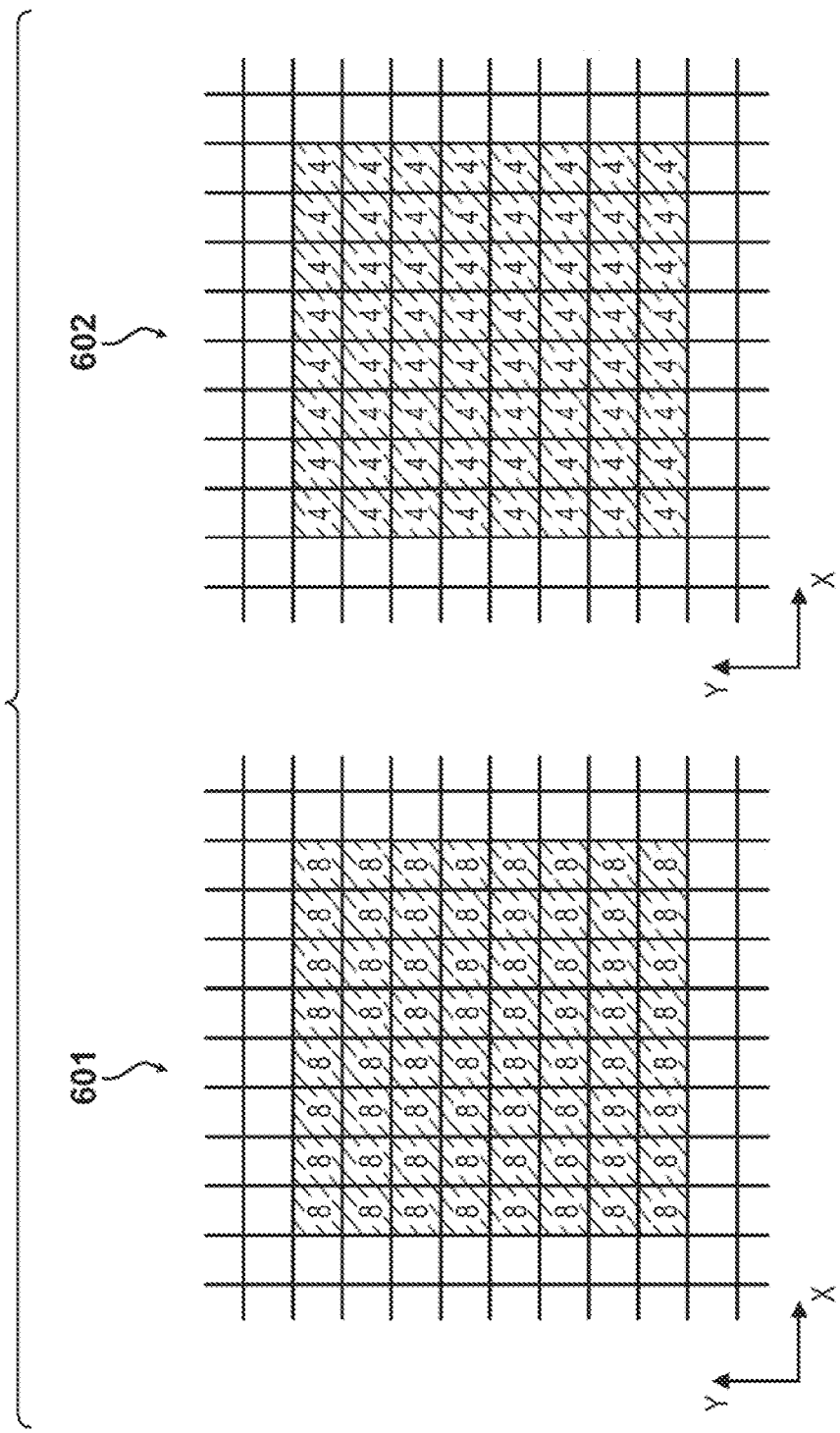

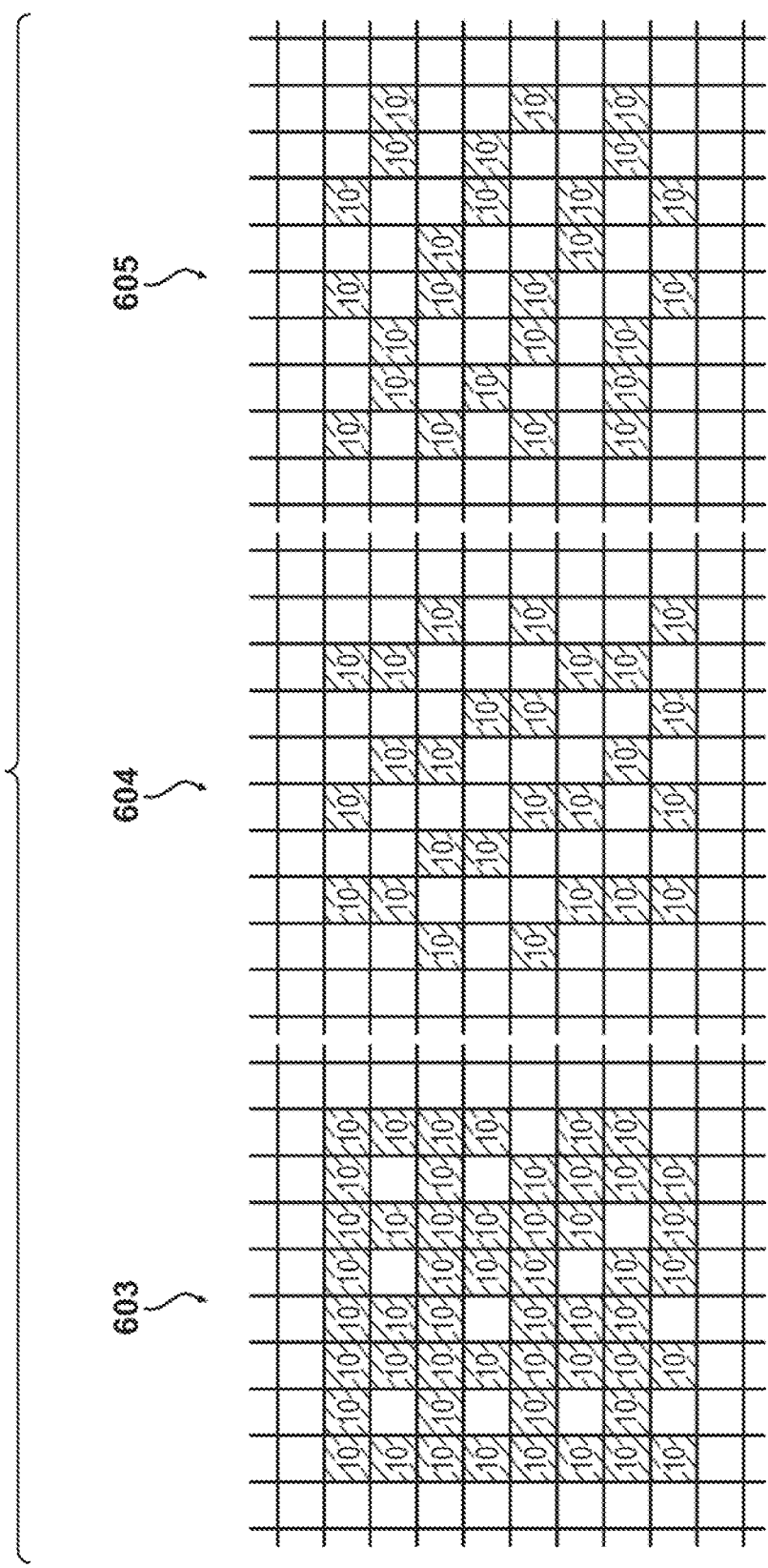

FIG. 6C
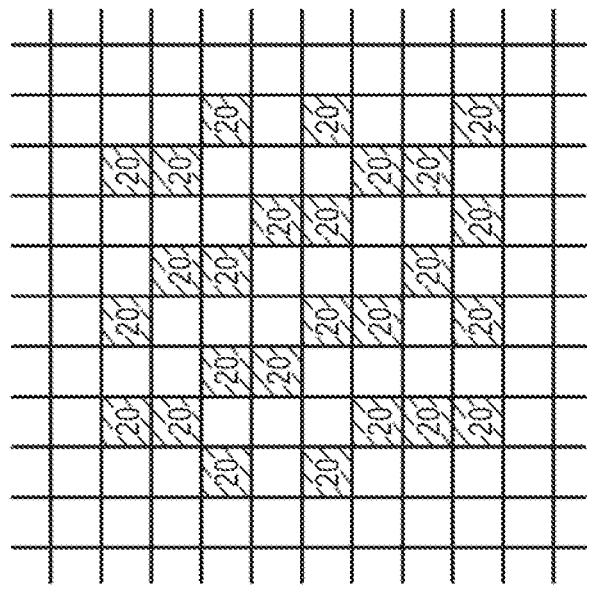
606
DOUBLE DRAWING (A + B)
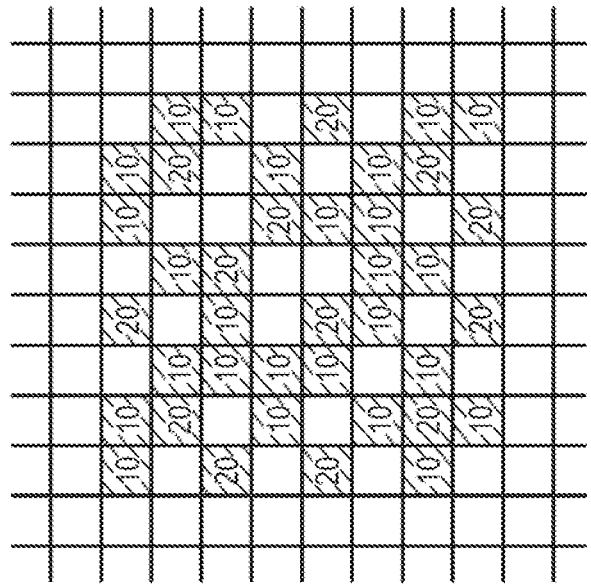
607
COMPARATIVE EXAMPLE: DOUBLE DRAWING (A + A)

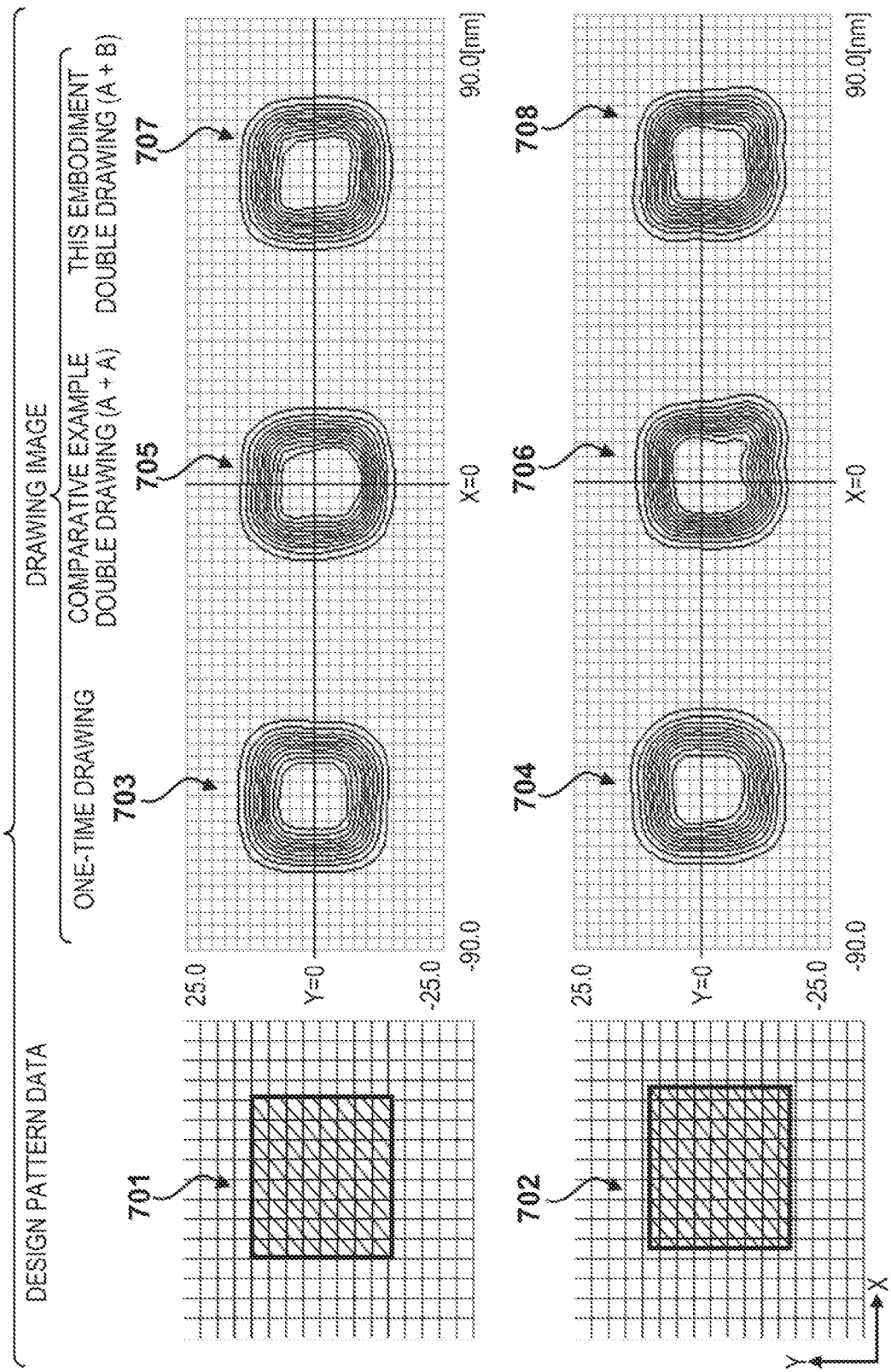

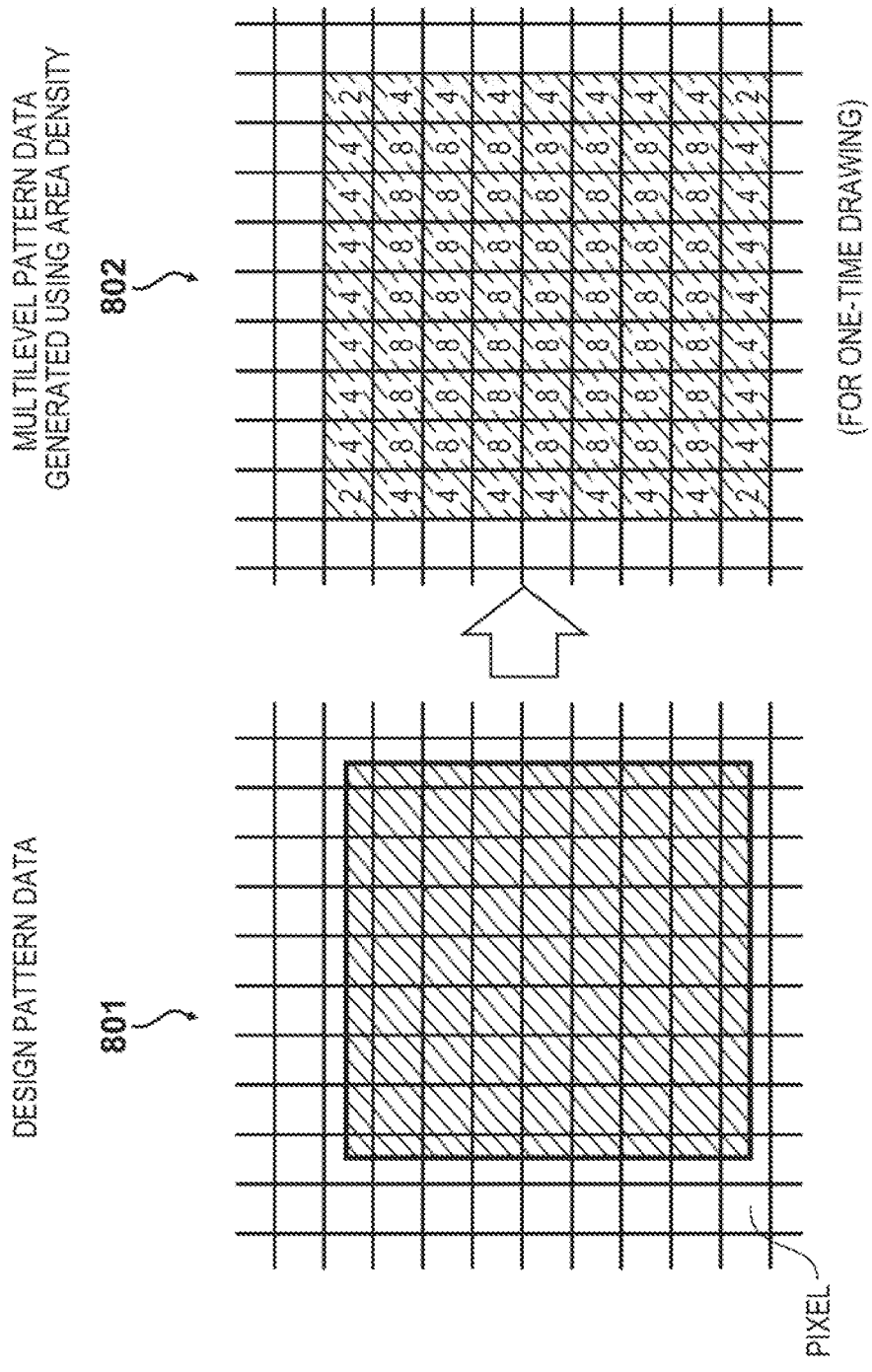

FIG. 10
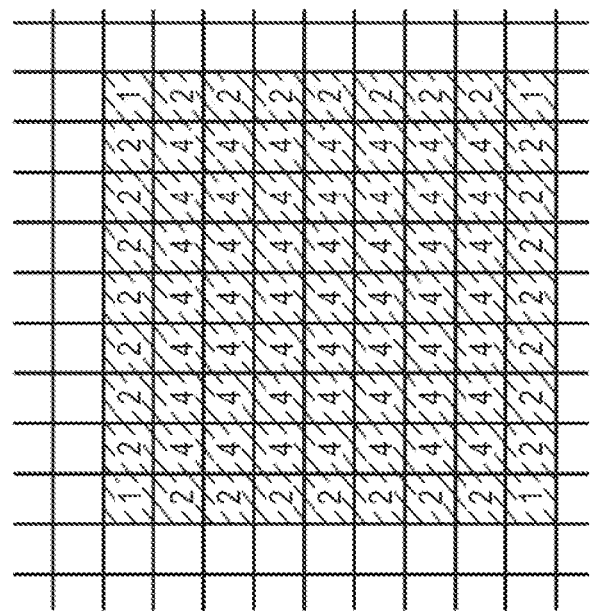
MULTILEVEL PATTERN DATA GENERATED USING AREA DENSITY
805
(FOR DOUBLE DRAWING)
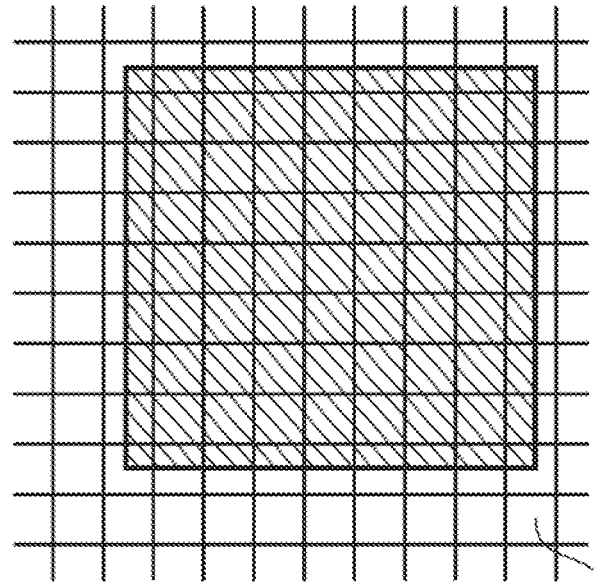
DESIGN PATTERN DATA
801
PIXEL FIG. 11
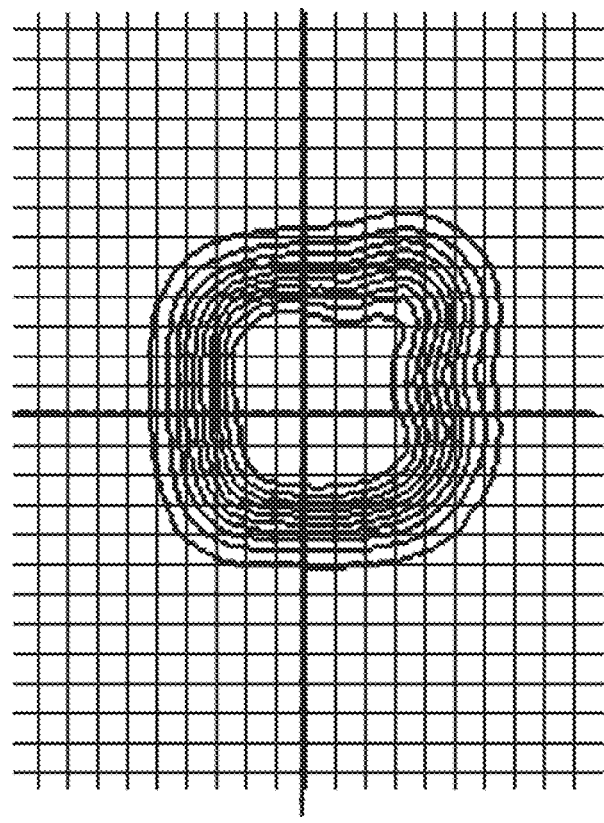
DRAWING IMAGE
807
(DOUBLE DRAWING RESULT)
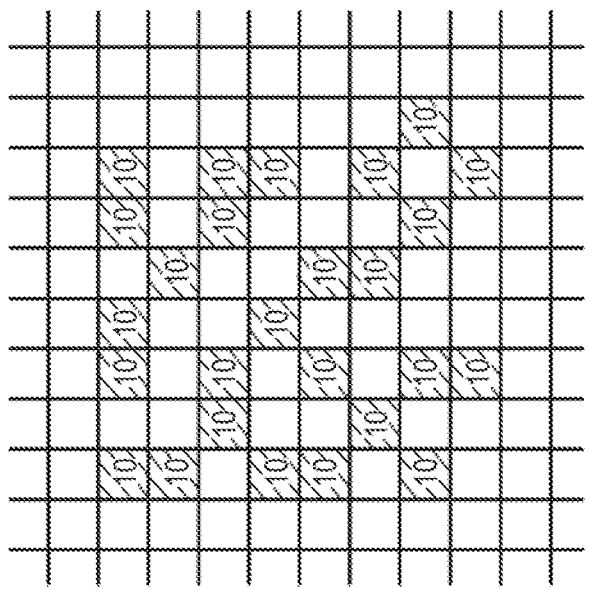
BINARY PATTERN DATA
GENERATED USING ERROR DIFFUSION
806
(FOR DOUBLE DRAWING)

F I G. 12

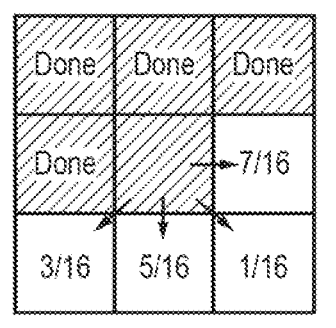

| Done | Done | Done |
|------|------|------|
| Done |      | 7/16 |
| 3/16 | 5/16 | 1/16 |

DRAWING APPARATUS, DATA PROCESSING METHOD, AND METHOD OF MANUFACTURING ARTICLE THAT TRANSFORM PARTIALLY OVERLAPPING REGIONS USING DIFFERENT TRANSFORMATION RULES

BACKGROUND OF THE INVENTION

1. Field of the Invention

The present invention relates to a drawing apparatus, a data processing method, and a method of manufacturing an article.

2. Description of the Related Art

A drawing apparatus which performs drawing on a substrate while scanning a beam such as a charged particle beam (for example, an electron beam or an ion beam) or a light beam is available. It is a common practice in the drawing apparatus to divide a region to be drawn into a plurality of partial regions to have overlap regions in which the partial regions overlap each other, and patterns are drawn in the plurality of partial regions with the beam. Such a scheme is called the stitching scheme. Drawing in an overlap region is done with two or more partial regions sharing the overlap region. Hence, when two partial regions share an overlap region, a pattern is drawn in the overlap region at a dose half that in the remaining region in drawing within each partial region.

As methods of controlling the dose, the time modulation and spatial modulation types are available. The time modulation method is used to control the time to irradiate a substrate with a beam, and is also called PWM (Pulse Width Modulation). The spatial modulation method is used to form a pattern using a plurality of pixels, and control the area density of pixels to be irradiated with a beam while keeping constant the time to irradiate each pixel with the beam. The spatial modulation method is described in "Proc. of SPIE Vol. 7970 79701AProc. (2011)".

An example in which binary pattern data to control drawing is generated by the spatial modulation method will be described with reference to FIGS. 8 to 12. Reference numeral 801 denotes the schematic structure of design pattern data obtained by arranging a design pattern on a pixel coordinate system defined in a drawing apparatus. In this example, the design pattern represented by the design pattern data 801 is a 20 nm×20 nm square pattern designed using a 0.25-nm grid, and pixel coordinates are given at a pixel pitch of 2.5 nm. Since the design grid is narrower than the pixel pitch, the design pattern cannot be faithfully displayed on a pixel coordinate system.

For this reason, the area density of a design pattern in each pixel is calculated, and the dose in each pixel is determined based on the obtained area density to generate multilevel pattern data. Reference numeral 802 denotes the schematic structure of the thus generated multilevel pattern data. Note that the dose (fixed value) of a beam per pixel in the drawing apparatus is assumed to be "10", while the dose (fixed value) per pixel in design pattern data 810 is assumed to be "8". Since the dose (fixed value) per pixel in the drawing apparatus is "10", multilevel pattern data is transformed into binary pattern data using an error diffusion method to control the dose of a design pattern at the density of pixels in which the beam is ON. As the error diffusion method, the Floyd & Steinberg error diffusion method, for example, can be adopted.

More specifically, binarization errors are distributed to peripheral pixels to be processed, in accordance with an error diffusion matrix (error diffusion kernel) shown in FIG. 12, while binarizing the value of a pixel of interest upon sequentially focusing attention on a plurality of pixels of the multilevel pattern data 802. The selection order of pixels of interest (the direction to progress transformation) can be determined by, for example, selecting the upper left pixel first, and performing raster scanning of subsequent pixels. If the value of a pixel of interest is smaller than 5, the binarization result of this pixel is set to "0"; otherwise, the binarization result of this pixel is set to "10". With such processing, binary pattern data is generated. Reference numeral 803 denotes the schematic structure of the thus generated binary pattern data.

Reference numeral 804 denotes the schematic structure of a drawing image (a latent image formed on a resist) drawn while controlling a beam in accordance with the binary pattern data 803. Note that the beam size is set sufficiently larger than a pixel with a size of 2.5 nm×2.5 nm to smooth a pattern formed in accordance with the density of pixels.

For an overlap region as mentioned above (doubly drawn region), multilevel pattern data 805 for double drawing is generated. A pixel in the multilevel pattern data 805 for double drawing has a value half that of a pixel in the multilevel pattern data 802 for one-time drawing. The multilevel pattern data 805 for double drawing is binarized in accordance with the above-mentioned method to generate binary pattern data 806 for double drawing. The density of pixels (ON pixels) having a value of "10" in the binary pattern data 806 for double drawing is lower than that in the binary pattern data 803 for one-time drawing. A pattern is drawn in an overlap region twice in accordance with the binary pattern data 806 for double drawing. Reference numeral 807 denotes the schematic structure of a drawing image drawn while controlling a beam in accordance with the binary pattern data 806.

The drawing image 807 formed by double drawing has a fidelity to the design pattern data 801, which is lower than that of the drawing image 804 formed by one-time drawing. With this arrangement, in the spatial modulation method, when an overlap region is provided to perform double drawing, the reproducibility of an actual drawing image to a design pattern degrades.

SUMMARY OF THE INVENTION

The present invention provides, for example, a technique advantageous in terms of the fidelity of drawing to a design pattern.

One of the aspects of the invention provides a drawing apparatus which performs drawing on a first partial region and a second partial region, the first and second partial regions having an overlap region in which the first and second partial regions overlap each other, the apparatus comprising: a transformation device configured to transform first pattern data for the first partial region into first quantized pattern data in accordance with a first transformation rule, and to transform second pattern data for the second partial region into second quantized pattern data in accordance with a second transformation rule different from the first transformation rule; and a controller configured to control the drawing on the first partial region based on the first quantized pattern data, and to control the drawing on the second partial region based on the second quantized pattern data.

Further features of the present invention will become apparent from the following description of exemplary embodiments with reference to the attached drawings.

BRIEF DESCRIPTION OF THE DRAWINGS

FIGS. 2A and 2B are views illustrating a method of drawing a pattern on a substrate;

FIG. 3 is a block diagram illustrating a data flow;

FIGS. 5A to 5D are views for explaining binarization using an error diffusion method;

FIG. 6A illustrates views of data processing by a data processing unit;

FIG. 6B illustrates views of another data processing by the data processing unit;

FIG. 6C illustrates views of still another data processing by the data processing unit;

FIG. 7 illustrates views of design pattern data and corresponding drawing images (latent images formed on a resist);

FIG. 8 illustrates views of an example in which binary pattern data to control drawing is generated using the spatial modulation method;

FIG. 10 illustrates views of still another example in which binary pattern data to control drawing is generated using the spatial modulation method;

FIG. 11 illustrates views of still another example in which binary pattern data to control drawing is generated using the spatial modulation method; and FIG. 12 is a view illustrating still another example in which binary pattern data to control drawing is generated using the spatial modulation method.

DESCRIPTION OF THE EMBODIMENTS

Embodiments of the present invention will be described below with reference to the accompanying drawings.

[First Embodiment]

Figure 1:
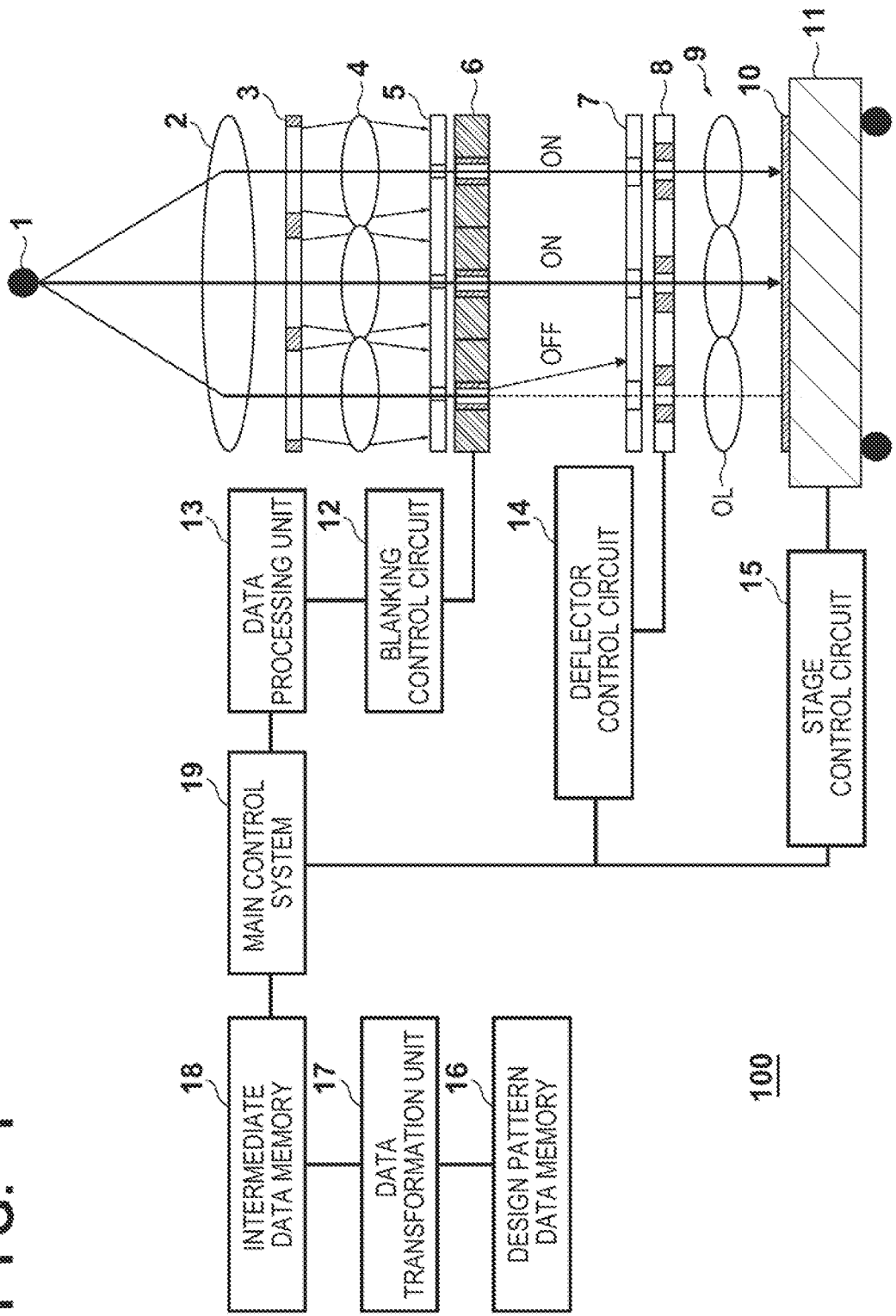
FIG. 1 is a view showing the configuration of a drawing apparatus according to an embodiment of the present invention.

FIG. 1 is a view showing the configuration of a drawing apparatus 100 according to an embodiment of the present invention. The drawing apparatus 100 shown in FIG. 1 serves as an electron beam drawing apparatus which uses an electron beam as a beam for drawing a pattern on a substrate. However, the drawing apparatus according to the present invention may serve not only as a drawing apparatus which uses an electron beam as a beam for drawing a pattern on a substrate, but also as a drawing apparatus which uses an ion beam or a light beam as the beam. A drawing apparatus which uses an electron beam or an ion beam can be called a charged particle beam drawing apparatus.

The drawing apparatus 100 can include an electron source 1, collimator lens 2, aperture array 3, condenser lens array 4, pattern aperture array 5, blanker array 6, blanking aperture array 7, deflector array 8, objective lens array 9, and stage 11.

The electron source 1 can be a thermoelectron (thermal electron) emission electron source including, for example, $LaB_6$ or BaO/W (dispenser cathode) as an electron emitting material. The collimator lens 2 can be an electrostatic lens which converges an electron beam by an electric field. An electron beam emitted by the electron source 1 is converted into a nearly collimated electron beam by the collimator lens 2.

The aperture array 3 is a component having a plurality of two-dimensionally arranged apertures. The condenser lens array 4 is a component formed by two-dimensionally arranging a plurality of electrostatic condenser lenses. The pattern aperture array 5 is a component formed by arranging arrays (sub-arrays) of pattern apertures, which define the cross-sectional shapes of electron beams, in correspondence with the respective condenser arrays of the condenser lens array 4.

The nearly collimated electron beam from the collimator lens 2 is split into a plurality of electron beams by the aperture array 3. The split electron beams are guided to the corresponding pattern apertures of the pattern aperture array 5 through the corresponding condenser lenses of the condenser lens array 4. The aperture array 3 defines the range in which the pattern aperture array 5 is irradiated with the electron beams.

The blanker array 6 is a component formed by arranging individually drivable electrostatic blankers (electrode pairs) in correspondence with the respective condenser lenses. The blanking aperture array 7 is a component formed by arranging blanking apertures in correspondence with the respective condenser lenses. The deflector array 8 is a component formed by arranging deflectors which deflect the electron beams in a predetermined direction in correspondence with the respective condenser lenses. The objective lens array 9 is a component formed by arranging electrostatic objective lenses OL in correspondence with the respective condenser lenses.

The electron beam from each aperture of the pattern aperture array 5 is reduced to, for example, $\frac{1}{100}$ through the corresponding blanker, blanking aperture, deflector, and objective lens OL, and is projected onto a substrate 10. Note that the surface on which the pattern aperture array 5 is arranged serves as an object plane, while the upper surface of the substrate 10 serves as an image plane.

If the electron beams from the pattern apertures of the pattern aperture array 5 are deflected by the corresponding blankers, they are blocked by the blanking aperture array 7, and do not strike the substrate 10. Such an electron beam is indicated by "Off" in FIG. 1. On the other hand, if the electron beams from the pattern apertures of the pattern aperture array 5 are not deflected by the corresponding blankers, they are not blocked by the blanking aperture array 7, and strike the substrate 10. Such control by the blankers can be called blanking control. Such an electron beam is indicated by "On" in FIG. 1. In parallel with blanking control, a plurality of electron beams incident on the substrate 10 are scanned on the substrate 10 by the same amount of deflection by the deflector array 8.

The electron emitting portion of the electron source 1 forms images on the blanking aperture array 7 through the collimator lens 2 and condenser lenses, and the images are set larger than the apertures of the blanking aperture array 7. Therefore, the semi-angle (half angle) of the electron beam on the substrate 10 is defined by the aperture of the blanking aperture array 7. Further, since the apertures of the blanking aperture array 7 are arranged at the front focal positions of the corresponding objective lenses OL, the principal rays of the electron beams from the pattern apertures of the sub-array almost perpendicularly strike the substrate 10. With this arrangement, even if the upper surface of the substrate 10 shifts vertically, the displacement of the electron beam within the horizontal plane is very small.

The stage 11 serves as an X-Y stage which holds the substrate 10 and is movable within an X-Y plane (horizontal plane) perpendicular to the beam axis (corresponding to the "optical axis" in an optical system). The stage 11 includes an electrostatic chuck (not shown) for holding the substrate 10, and a detector (not shown) which detects the position of the electron beam.

The drawing apparatus 100 can include blocks denoted by reference numerals 12 to 19, in addition to the above-mentioned constituent elements. A blanking control circuit (control unit) 12 individually controls a plurality of blankers which constitute the blanker array 6. A data processing unit 13 generates blanker data (binary pattern data) for controlling the blanking control circuit 12, and sends it to the blanking control circuit 12. A deflector control circuit 14 controls a plurality of deflectors, which constitute the deflector array 8, in accordance with a common signal. A stage control circuit 15 controls positioning of the stage 11 in cooperation with a laser interferometer (not shown) which measures the position of the stage 11.

A design pattern data memory 16 stores design pattern data. A data transformation unit 17 transforms the design pattern data into intermediate data. The intermediate data is obtained by dividing the design pattern data into stripe drawing regions (partial regions) with a width set by the drawing apparatus 100. The intermediate data is stored in an intermediate data memory 18. A main control system 19 transfers the intermediate data to the data processing unit 13, and controls the deflector control circuit 14 and stage control circuit 15. Note that a circuit which implements functions provided by the blocks 12 to 19 is not limited to an example shown in FIG. 1, and can have various configurations.

Figure 2A:
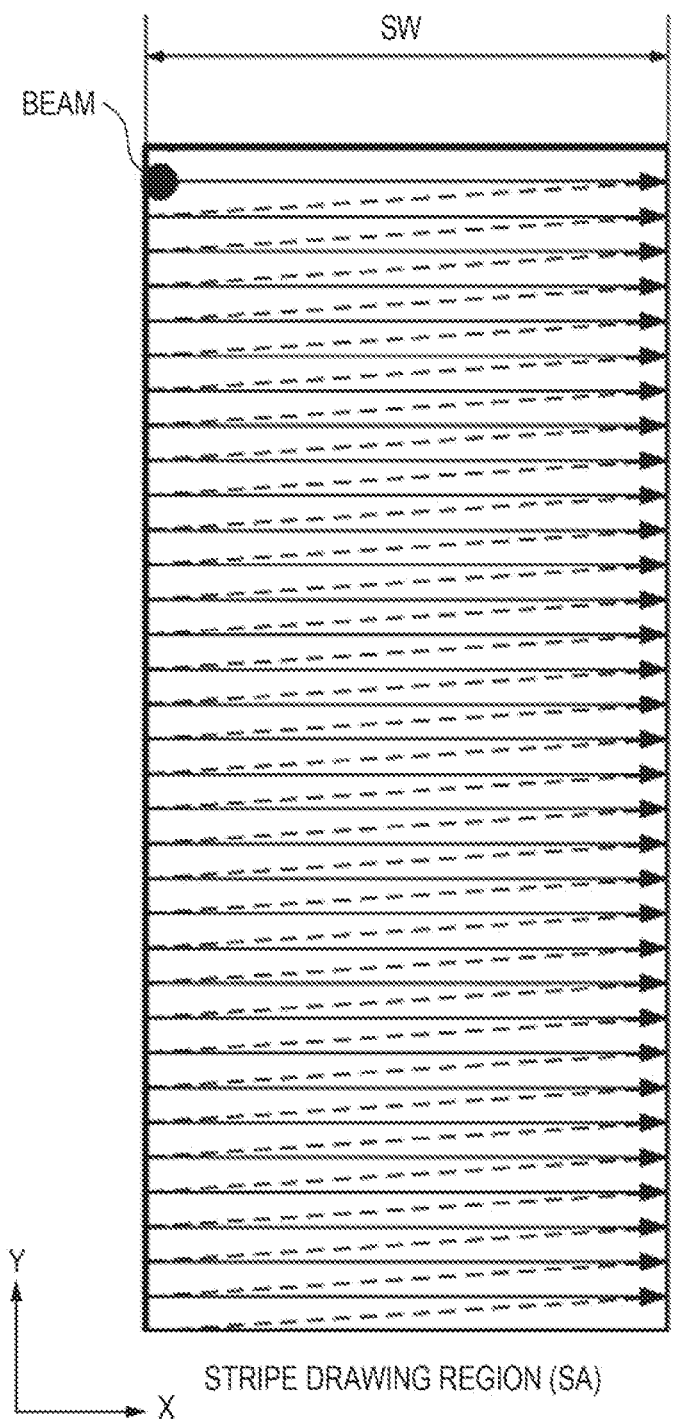

An exemplary method of drawing a pattern on a substrate will be described with reference to FIGS. 2A and 2B. In an example shown in FIGS. 2A and 2B, a pattern is drawn on a substrate by raster scanning. Referring to FIG. 2A, the electron beam undergoes raster scanning on the scanning grid on the substrate 10, which is determined based on the deflection characteristics of the electron beam by the deflector array 8, and the position of the stage 11. In parallel with this operation, the irradiation (ON)/non-irradiation (OFF) of the substrate 10 with the electron beam is controlled by the blanker array 6 to draw a pattern in a stripe drawing region (partial region) SA with a stripe width SW of 2 μm.

FIG. 2B shows an exemplary positional relationship between each objective lens OL and the stripe drawing region SA. The objective lens array 9 has a configuration in which objective lenses OL are arranged at a pitch of 130 μm in the X-direction to form one row, and objective lenses OL are arranged with a shift of 2 μm in the X-direction between adjacent rows. Although FIG. 2B shows an array of 4 (rows)×8 (columns) objective lenses for the sake of simplicity, 65 (rows)×200 (columns) objective lenses (a total of 13,000 objective lenses), for example, can be arranged in practice. With such a configuration, a pattern can be drawn in an exposure region EA (for example, a dimension of 26 mm in the X-direction) on the substrate 10 by continuously moving (scanning) the stage 11 in one direction along the Y-direction. That is, a pattern can be drawn in a shot region with a size of 26×33 mm by full-field scanning.

FIG. 3 is a block diagram showing an exemplary data flow. Design pattern data 101 includes, for example, the graphics data of a vector shot pattern (data corresponding to a graphics which falls within 26×33 mm), and is stored in the design pattern data memory 16.

Figure 4:
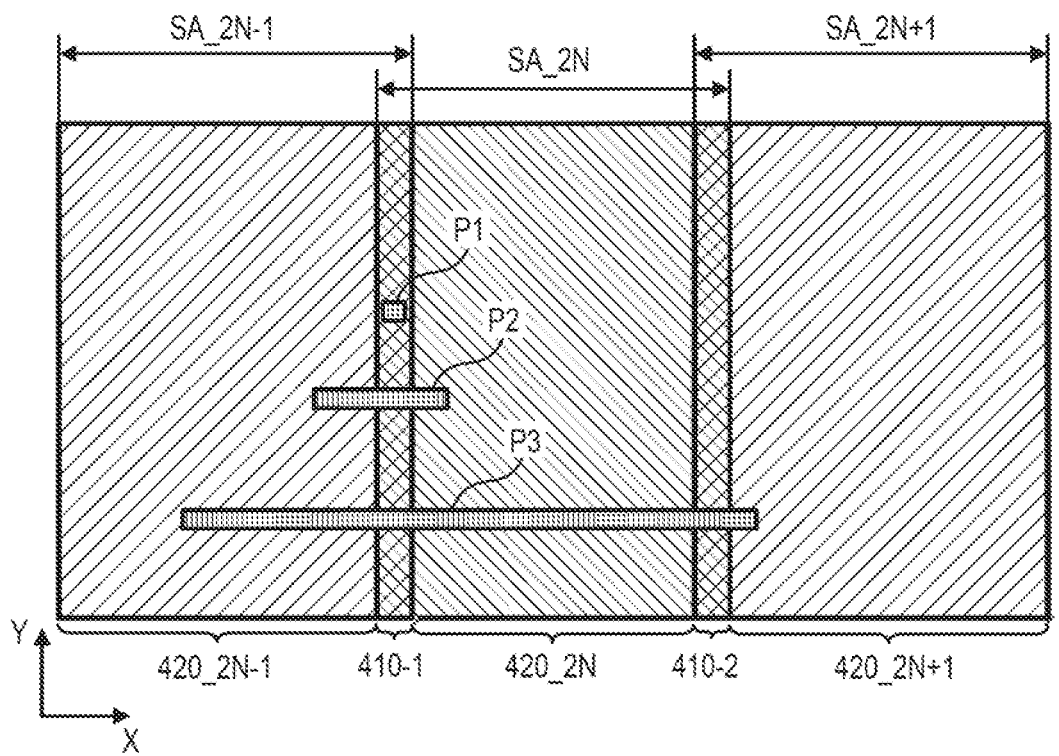
FIG. 4 is a view illustrating a plurality of stripe drawing regions (partial regions)

Transformation processing 102 is executed by the data transformation unit 17. In the transformation processing 102, proximity effect correction is performed for the design pattern data 101, and graphics data having undergone proximity effect correction is divided into a plurality of stripe drawing regions SA. Each stripe drawing region SA has a size determined in accordance with the specifications of the drawing apparatus 100. Also, this division operation is done so that adjacent stripe drawing regions (partial regions) SA have overlap regions 410-1 and 410-2, as illustrated in FIG. 4. FIG. 4 shows three stripe drawing regions (partial regions) SA_2N−1, SA_2N, and SA_2N+1. Note that suffixes "2N−1", "2N", and "2N+1" are added for the sake of distinction between the individual stripe drawing regions SA. As an example, the widths (the dimensions in the X-direction) of the stripe drawing regions SA_2N−1, SA_2N, and SA_2N+1 are 2.2 μm, and those of the overlap regions 410-1 and 410-2 are 0.2 μm.

A pattern is drawn in the overlap region 410-1 at the times of drawing in both the stripe drawing regions SA_2N−1 and SA_2N. A pattern is drawn in the overlap region 410-2 at the times of drawing in both the stripe drawing regions SA_2N and SA_2N+1.

An entire pattern P1 is arranged in the overlap region 410-1 with the stripe drawing regions SA_2N−1 and SA_2N. A pattern P2 has a portion arranged in a one-time drawing region (a region drawn only once) 420_2N−1 of the stripe drawing region SA_2N−1, that arranged in the overlap region 410-1, and that arranged in a one-time drawing region 420_2N of the stripe drawing region SA_2N. A pattern P3 has a portion arranged in one-time drawing regions 420_2N−1, 420_2N, and 420_2N+1, and that arranged in the overlap regions 410-1 and 410-2. Data of each of the plurality of stripe drawing regions SA is stored in the intermediate data memory 18 as intermediate data. The intermediate data can typically be vector data. A series of processing until the intermediate data is stored in the intermediate data memory 18 is typically performed only once to draw a pattern on substrates in one lot.

Processing of drawing a pattern on the substrate 10 will be described below. The main control system 19 sends data of each of the plurality of stripe drawing regions SA, which is stored in the intermediate data memory 18, to the data processing unit 13 in a predetermined order. The data processing unit 13 transforms each sent data into multilevel pattern data 104 compatible with a pixel coordinate system determined in accordance with the specifications of the drawing apparatus 100. More specifically, the data processing unit 13 calculates the area density in each pixel, and performs correction of variations in beam intensity used to draw each stripe, and dose correction (basically halving) in an overlap region to generate multilevel pattern data 104 for each stripe drawing region.

The data processing unit 13 further performs data processing 105 for the multilevel pattern data 104 for each stripe drawing region. The data processing 105 can include coordinate transformation, binarization after the coordinate transformation, and serial data transformation after the binarization. Note that binarization is one mode of quantization.

Coordinate transformation can be done based on a pattern already formed on the substrate 10, or distortion (expansion/contraction pr and rotation Or) of a shot region, in order to reduce an overlay error between this pattern and a pattern to be formed on it. Coordinate transformation can be done in accordance with, for example:

$$\begin{pmatrix} x' \\ y' \end{pmatrix} = \begin{pmatrix} Ox \\ Oy \end{pmatrix} + \begin{pmatrix} 1+\beta r & 0 \\ 0 & 1+\beta r \end{pmatrix} \begin{pmatrix} 1 & -\theta r \\ \theta r & 1 \end{pmatrix} \begin{pmatrix} x \\ y \end{pmatrix} \quad (1)$$

where x and y are the coordinates before correction, x' and y' are the coordinates after correction, and Ox and Oy are offsets for correcting the difference between the design position and actual position of an electron beam.

Binarization is processing of transforming multilevel pattern data having undergone coordinate transformation into binary pattern data using an error diffusion method. As the error diffusion method, the Floyd & Steinberg error diffusion method, for example, can be adopted. Note that in binarization, the data processing unit 13 binarizes adjacent stripe drawing regions in accordance with different transformation rules.

Note that for the sake of convenience, adjacent stripe drawing regions are defined as a first stripe drawing region (first partial region) and a second stripe drawing region (second partial region). Also, the multilevel pattern data of the first strip region is defined as first multilevel pattern data, and that of the second stripe drawing region is defined as second multilevel pattern data. Moreover, the binary pattern data (quantized pattern data) of the first stripe drawing region is defined as first binary pattern data (first quantized pattern data), and that of the second stripe drawing region is defined as second binary pattern data (second quantized pattern data). The data processing unit 13 transforms first multilevel pattern data to control drawing in the first stripe drawing region (first partial region) into first binary pattern data in accordance with a first transformation rule. The data processing unit 13 also transforms second multilevel pattern data to control drawing in the second stripe drawing region (second partial region) into second binary pattern data in accordance with a second transformation rule different from the first transformation rule.

Figure 5A:
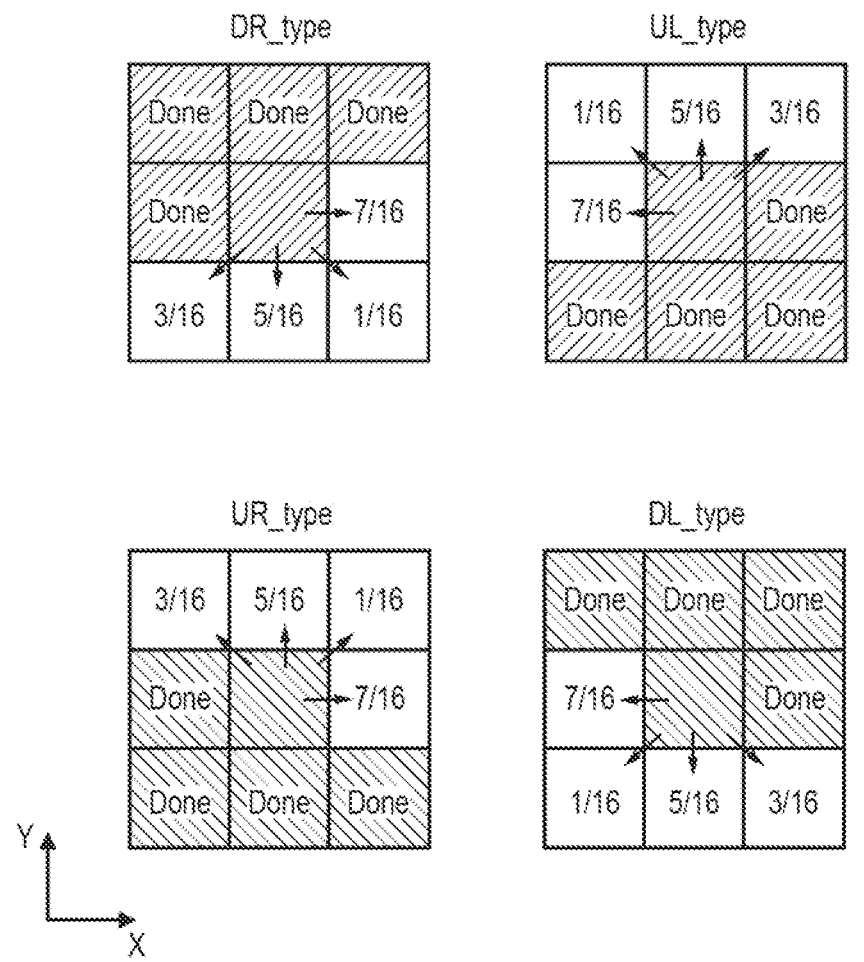
Figure 9:
FIG. 9 illustrates views of another example in which binary pattern data to control drawing is generated using the spatial modulation method.

FIG. 5A illustrates four examples of a transformation rule (defined by an error diffusion matrix in this case) for transforming multilevel pattern data into binary pattern data using the error diffusion method. FIG. 5B illustrates three examples of assignment of the transformation rules to the stripe drawing regions (partial regions).

In Case1 shown in FIG. 5B, a transformation rule DR_type shown in FIG. 5A is used for an odd-numbered ((2N−1)th) stripe drawing region (corresponding to the stripe drawing region SA_2N−1 in FIG. 4). Also, a transformation rule UL_type shown in FIG. 5A is used for an even-numbered ((2N)th) stripe drawing region (corresponding to the stripe drawing region SA_2N in FIG. 4). In the transformation rule DR_type, transformation is performed using an error diffusion matrix which distributes, to the right, lower right, lower, and lower left pixels with respect to a pixel of interest, an error (the difference between the value of the pixel of interest and a threshold) generated when the pixel of interest is binarized. In the transformation rule UL_type, transformation is performed using an error distribution matrix which distributes, to the left, upper left, upper, and upper right pixels with respect to a pixel of interest, an error generated when the pixel of interest is binarized.

Note that the positional relationship between a pixel of interest and a pixel group at the destination to which an error generated when the value of the pixel of interest is binarized is distributed is different between the transformation rules DR_type and UL_type. In other words, in the transformation rule DR_type which exemplifies the first transformation rule, an error generated when the value of a pixel of interest is binarized is diffused to a pixel group in a first positional relationship with the pixel of interest. In the transformation rule UL_type which exemplifies the second transformation rule, an error generated when the value of a pixel of interest is binarized is diffused to a pixel group in a second positional relationship different from the first positional relationship with the pixel of interest. The directions of pixel groups at the destinations to which errors are distributed in the transformation rules DR_type and UL_type are opposite to each other.

Serial data transformation after binarization can include processing of sorting data of a pixel group which constitutes binary pattern data in a drawing order. The processed binary pattern data will be referred to as blanker data 106 hereinafter for the sake of convenience, but the blanker data 106 is also binary pattern data. Each blanker data 106 is sequentially sent to the blanking control circuit 12. The blanking control circuit 12 transforms the blanker data 106 into a control signal for controlling the blanker array 6, and supplies the control signal to the blanker array 6 via a signal line such as an optical fiber. The blanking control circuit 12 controls drawing in the corresponding stripe drawing region based on the blanker data 106 for each stripe drawing region (partial region). For example, the blanking control circuit 12 controls drawing in the first stripe drawing region (first partial region) based on the blanker data (binary pattern data) 106 for the first stripe drawing region (first partial region). The blanking control circuit 12 also controls drawing in the second stripe drawing region (second partial region) based on the blanker data (binary pattern data) 106 for the second stripe drawing region (second partial region).

The data processing 105 by the data processing unit 13 will be exemplified below with reference to FIGS. 6A to 6C. Referring to FIG. 6A, reference numerals 601 and 602 denote multilevel pattern data (20 nm×20 nm square pattern) when the dose per pixel on a pixel coordinate system (pixel pitch=2.5 nm) is set to "8". Note that reference numeral 601 denotes multilevel pattern data for the one-time drawing region 420_2N−1; and 602, multilevel pattern data for the overlap region 410-1. The value of the multilevel pattern data 602 in the overlap region 410-1 is half that of the multilevel pattern data 601 for the one-time drawing region 420_2N−1.

Referring to FIG. 6B, reference numerals 603, 604, and 605 denote examples of the results of transforming multilevel pattern data into binary pattern data in accordance with the error diffusion method. Note that reference numeral 603 denotes binary pattern data obtained by binarizing the one-time drawing region 420_2N−1 of the odd-numbered stripe drawing region SA_2N−1 using the error diffusion method in accordance with the transformation rule DR_type, and this data is equivalent to a dose map. Reference numeral 604 denotes binary pattern data obtained by binarizing the multilevel pattern data of the overlap region 410-1 using the error diffusion method in accordance with the transformation rule DR_type for the odd-numbered stripe drawing region SA_2N−1. Reference numeral 605 denotes binary pattern data obtained by binarizing the multilevel pattern data of the overlap region 410-1 using the error diffusion method in accordance with the transformation rule UL_type for the even-numbered stripe drawing region SA_2N.

The binary pattern data 604 and 605 are obtained by binarizing identical multilevel pattern data 602, but are obtained using different transformation rules in binarization. Therefore, the binary pattern data 604 and 605 are different binary pattern data.

Referring to FIG. 6C, reference numeral 606 denotes a dose map obtained by combining the binary pattern data 604 and 605. A dose indicated by the dose map 606 is equivalent to the result of drawing in the overlap region 410-1 in accordance with the binary pattern data 604, and drawing in the overlap region 410-1 in accordance with the binary pattern data 605. Reference numeral 607 denotes a dose map when double drawing is performed in the overlap region 410-1 in accordance with the binary pattern data 604 as a Comparative Example. The dose map 606 is obtained by combining binary pattern data generated in accordance with different transformation rules, and shows an averaging effect. Therefore, the dose map 606 is closer to the dose map 603 in one-time drawing than the dose map 607 as the Comparative Example.

FIG. 7 illustrates views of design pattern data and corresponding drawing images (latent images formed on a resist).

Note that reference numerals 701 and 702 denote design pattern data. Reference numerals 703 and 704 correspond to the design pattern data 701 and 702, respectively, and denote the schematic structures of drawing images (latent images) formed by one-time drawing. Reference numerals 705 and 706 correspond to the design pattern data 701 and 702, respectively, and denote the schematic structures of drawing images (latent images) formed by double drawing in accordance with identical binary pattern data using the method according to the above-mentioned Comparative Example. Reference numerals 707 and 708 correspond to the design pattern data 701 and 702, respectively, and denote the schematic structures of drawing images (latent images) formed by double drawing in accordance with binary pattern data formed in accordance with different transformation rules using the method according to this embodiment. According to this embodiment, it is obvious that the drawing image has a small distortion.

Also, as a result of evaluating variations in line width, ΔCD in one-time drawing was 0.37 nm, ΔCD in the Comparative Example was 0.68 nm, and ΔCD in this embodiment was 0.07 nm. This reveals that the variations in line width are considerably smaller in this embodiment than in the Comparative Example.

[Second Embodiment]

The second embodiment of the present invention will be described below. Note that details which are not particularly referred to in the second embodiment can be the same as in the first embodiment.

The combination of transformation rules for generating binary pattern data for each of adjacent stripe drawing regions (partial regions) having an overlap region in which partial regions overlap each other is not limited to the first embodiment. FIG. 5B shows two other examples as Case2 and Case3.

Case2 will be described first. In Case2, a transformation rule DR_type shown in FIG. 5A is used for an odd-numbered ((2N−1)th) stripe drawing region (corresponding to a stripe drawing region SA_2N−1 in FIG. 4). However, a transformation rule DL_type shown in FIG. 5A is used for an even-numbered ((2N)th) stripe drawing region (corresponding to a stripe drawing region SA_2N in FIG. 4), as described earlier. In the transformation rule DR_type, transformation is performed using an error diffusion matrix which distributes, to the right, lower right, lower, and lower left pixels with respect to a pixel of interest, an error (the difference between the value of the pixel of interest and a threshold) generated when the pixel of interest is binarized. In the transformation rule DL_type, transformation is performed using an error distribution matrix which distributes, to the left, upper left, upper, and upper right pixels with respect to a pixel of interest, an error generated when the pixel of interest is binarized.

FIG. 5C shows motion in an error diffusion matrix in Case2 (in other words, the selection order, that is, the binarization execution order of pixels of interest, or the direction to progress transformation). For an odd-numbered ((2N−1)th) stripe drawing region (corresponding to the stripe drawing region SA_2N−1 in FIG. 4), an operation of progressing the error diffusion matrix to the right side upon defining, as an origin, the upper left pixel in an image represented by multilevel pattern data, returning it to the left end as it reaches the right end, and changing the row to be binarized to the immediately lower one is repeated. For an even-numbered ((2N)th) stripe drawing region (corresponding to the stripe drawing region SA_2N in FIG. 4), an operation of progressing the error diffusion matrix to the left side upon defining, as an origin, the upper right pixel in an image represented by multilevel pattern data, returning it to the right end as it reaches the left end, and changing the row to be binarized to the immediately lower one is repeated.

Note that for an odd-numbered ((2N−1)th) stripe drawing region, the order of rows to be binarized in accordance with the transformation rule DR_type which exemplifies the first transformation rule is the same as that of rows to be drawn in accordance with binary pattern data generated by the binarization operation. Also, for an even-numbered ((2N)th) stripe drawing region, the order of rows to be binarized in accordance with the transformation rule DL_type which exemplifies the second transformation rule is the same as that of rows to be drawn in accordance with binary pattern data generated by the binarization operation. With this operation, every time one row of an image which forms a stripe drawing region ends, drawing can be performed in accordance with binary pattern data generated by the binarization operation, thus reducing the memory capacity required to store data.

Case3 will be described next. In Case3, for an odd-numbered ((2N−1)th) stripe drawing region (corresponding to the stripe drawing region SA_2N−1 in FIG. 4), the transformation rules DR_type and DL_type shown in FIG. 5A are alternately used. However, for an even-numbered ((2N)th) stripe drawing region (corresponding to the stripe drawing region SA_2N in FIG. 4), the transformation rules DL_type and DR_type shown in FIG. 5A are alternately used.

FIG. 5C shows motion in an error diffusion matrix in Case3 (in other words, the selection order, that is, the binarization execution order of pixels of interest, or the direction to progress transformation). For an odd-numbered ((2N−1)th) stripe drawing region, an operation of progressing the error diffusion matrix in the transformation rule DR_type from the left to the right for odd-numbered rows, and progressing the error diffusion matrix in the transformation rule DL_type from the right to the left for even-numbered rows is repeated. For an even-numbered ((2N)th) stripe drawing region, an operation of progressing the error diffusion matrix in the transformation rule DL_type from the right to the left for odd-numbered rows, and progressing the error diffusion matrix in the transformation rule DR_type from the left to the right for even-numbered rows is repeated.

In Case3, in addition to the effect of Case2, since a plurality of different transformation rules are used in processing each stripe drawing region, an effect of reducing moiré can be obtained.

Although the Floyd & Steinberg error diffusion method is used in the above-mentioned embodiment, the Jarvis, Judice & Ninke error diffusion method, as shown in FIG. 5D, may also be used.

A transformation rule UR_type shown in FIG. 5A may also be used. In the transformation rule UR_type, transformation is performed using an error distribution matrix which distributes, to the right, upper right, upper, and upper left pixels with respect to a pixel of interest, an error generated when the pixel of interest is binarized.

[Application Example]

A method of manufacturing an article according to an embodiment of the present invention is suitable for manufacturing various articles including a microdevice such as a semiconductor device and an element having a microstructure. The manufacturing method can include a step of forming a latent image pattern on a photosensitive agent, applied onto a substrate, using the above-mentioned drawing apparatus (a step of performing drawing on a substrate), and a step of developing the substrate having the latent image pattern formed on it in the forming step. The manufacturing method can also include subsequent known steps (for example, oxidation, film formation, vapor deposition, doping, planarization, etching, resist removal, dicing, bonding, and packaging). The method of manufacturing an article according to this embodiment is more advantageous in terms of at least one of the performance, quality, productivity, and manufacturing cost of an article than the conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-138195, filed Jun. 19, 2012, and No. 2013-105628, filed May 17, 2013, which are hereby incorporated by reference herein in their entirety.

What is claimed is:

1. A drawing apparatus which performs drawing on a first partial region and a second partial region, the first and second partial regions having an overlap region in which the first and second partial regions overlap each other, the apparatus comprising:
   a transformation device configured to transform first pattern data for the first partial region into first quantized pattern data in accordance with a first transformation rule, and to transform second pattern data for the second partial region into second quantized pattern data in accordance with a second transformation rule different from the first transformation rule; and
   a controller configured to control the drawing on the first partial region based on the first quantized pattern data, and to control the drawing on the second partial region based on the second quantized pattern data.

2. The apparatus according to claim 1, wherein
   the first transformation rule and the second transformation rule are rules according to an error diffusion method, and
   an error generated by quantization of a value of a pixel of interest is diffused to a pixel group in a first positional relationship with the pixel of interest in the first transformation rule, and an error generated by quantization of a value of a pixel of interest is diffused to a pixel group in a second positional relationship, different from the first positional relationship, with the pixel of interest in the second transformation rule.

3. The apparatus according to claim 1, wherein a direction in which the transformation device progresses the transformation on each row of the first partial region is opposite to a direction in which the transformation device progresses the transformation on each row of the second partial region.

4. The apparatus according to claim 1, wherein
   with respect to each row of the first partial region, a direction in which the transformation device progresses the transformation is identical to a direction in which the drawing is performed based on the first quantized pattern data, and
   with respect to each row of the second partial region, a direction in which the transformation device progresses the transformation is identical to a direction in which the drawing is performed based on the second quantized pattern data.

5. The apparatus according to claim 1, wherein a beam used to perform the drawing in the first partial region is different from a beam used to perform the drawing in the second partial region.

6. The apparatus according to claim 1, wherein the drawing in the first partial region and the drawing in the second partial region are performed in parallel.

7. The apparatus according to claim 1, wherein the apparatus is configured to perform the drawing by scanning one of a charged particle beam and a light beam.

8. A method of manufacturing an article, the method comprising:
   performing drawing on a substrate using a drawing apparatus;
   developing the substrate having undergone the drawing; and
   processing the developed substrate to manufacture the article,
   wherein the drawing apparatus performs drawing on a first partial region and a second partial region of the substrate, the first and second partial regions having an overlap region in which the first and second partial regions overlap each other, the apparatus comprising:
   a transformation device configured to transform first pattern data for the first partial region into first quantized pattern data in accordance with a first transformation rule, and to transform second pattern data for the second partial region into second quantized pattern data in accordance with a second transformation rule different from the first transformation rule; and
   a controller configured to control the drawing on the first partial region based on the first quantized pattern data, and to control the drawing on the second partial region based on the second quantized pattern data.

9. A data processing method of generating data for controlling drawing in a drawing apparatus which performs drawing on a first partial region and a second partial region, the first and second partial regions having an overlap region in which the first and second partial regions overlap each other, the method comprising:
   transforming first pattern data for the first partial region into first quantized pattern data in accordance with a first transformation rule; and
   transforming second pattern data for the second partial region into second quantized pattern data in accordance with a second transformation rule different from the first transformation rule.

10. The method according to claim 9, wherein
   the first transformation rule and the second transformation rule are rules according to an error diffusion method, and
   an error generated by quantization of a value of a pixel of interest is diffused to a pixel group in a first positional relationship with the pixel of interest in the first transformation rule, and an error generated by quantization of a value of a pixel of interest is diffused to a pixel group in a second positional relationship, different from the first positional relationship, with the pixel of interest in the second transformation rule.

* * * * *